(12) United States Patent
Grodzki

(10) Patent No.: US 10,126,399 B2
(45) Date of Patent: Nov. 13, 2018

(54) METHOD AND APPARATUS FOR MOVEMENT CORRECTION IN A MAGNETIC RESONANCE FINGERPRINTING EXAMINATION OF A SUBJECT

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 535 days.

(21) Appl. No.: 14/865,025

(22) Filed: Sep. 25, 2015

(65) Prior Publication Data

US 2016/0091591 A1 Mar. 31, 2016

(30) Foreign Application Priority Data

Sep. 25, 2014 (DE) .................. 10 2014 219 467

(51) Int. Cl.
*G01R 33/565* (2006.01)
*G01R 33/50* (2006.01)
*G01R 33/563* (2006.01)

(52) U.S. Cl.
CPC ........ *G01R 33/56509* (2013.01); *G01R 33/50* (2013.01); *G01R 33/56341* (2013.01)

(58) Field of Classification Search
CPC .............. G01R 33/56509; G01R 33/50; G01R 33/56341
USPC ........................................................ 324/309
See application file for complete search history.

(56) References Cited

U.S. PATENT DOCUMENTS

| 5,766,128 | A | 6/1998 | Halamek et al. |
| 2009/0028411 | A1 | 1/2009 | Pfeuffer |
| 2009/0177076 | A1 | 7/2009 | Aldefeld et al. |
| 2010/0189324 | A1 | 7/2010 | Wollenweber et al. |
| 2012/0051664 | A1* | 3/2012 | Gopalakrishnan .... G06T 11/005 382/294 |

(Continued)

OTHER PUBLICATIONS

Glover et al., "Image-Based Method for Retrospective Correction of Physiological Motion Effects in fMRI: RETROICOR," Magnetic Resonance in Medicine, vol. 44, pp. 162-167 (2000).

(Continued)

*Primary Examiner* — Susan Lee
(74) *Attorney, Agent, or Firm* — Schiff Hardin LLP

(57) ABSTRACT

In a method and apparatus for movement correction for a magnetic resonance fingerprinting examination on an object under examination, a magnetic resonance signal shape of a region of the object is acquired using the magnetic resonance fingerprinting method, movement data for at least one sub-region of the region are detected movement information is generated from the acquired movement data, the acquired magnetic resonance signal shape is corrected with reference to the generated movement information, a signal comparison of the corrected magnetic resonance signal shape is made with multiple database signal shapes stored in a database, with a database value of at least one tissue parameter being assigned to each of the database signal shapes. A value of the at least one tissue parameter is assigned to the corrected signal shape as a result of the signal comparison.

10 Claims, 2 Drawing Sheets

(56) References Cited

U.S. PATENT DOCUMENTS

| | | | |
|---|---|---|---|
| 2014/0012127 A1* | 1/2014 | Biber | A61B 5/6817 |
| | | | 600/411 |
| 2014/0099010 A1 | 4/2014 | Rapoport | |
| 2014/0221812 A1* | 8/2014 | Heismann | A61B 5/055 |
| | | | 600/407 |
| 2015/0323637 A1 | 11/2015 | Beck et al. | |

OTHER PUBLICATIONS

Le et al., "Retrospective Estimation and Correction of Physiological Artifacts in fMRI by Direct Extraction of Physiological Activity from MR Data," Magnetic Resonance in Medicine, vol. 35, pp. 290-298 (1996).

Ma et. al,.: "Magnetic Resonance Fingerprinting", Nature. vol. 495, No. 7440, pp. 187-192;( 2013).

* cited by examiner

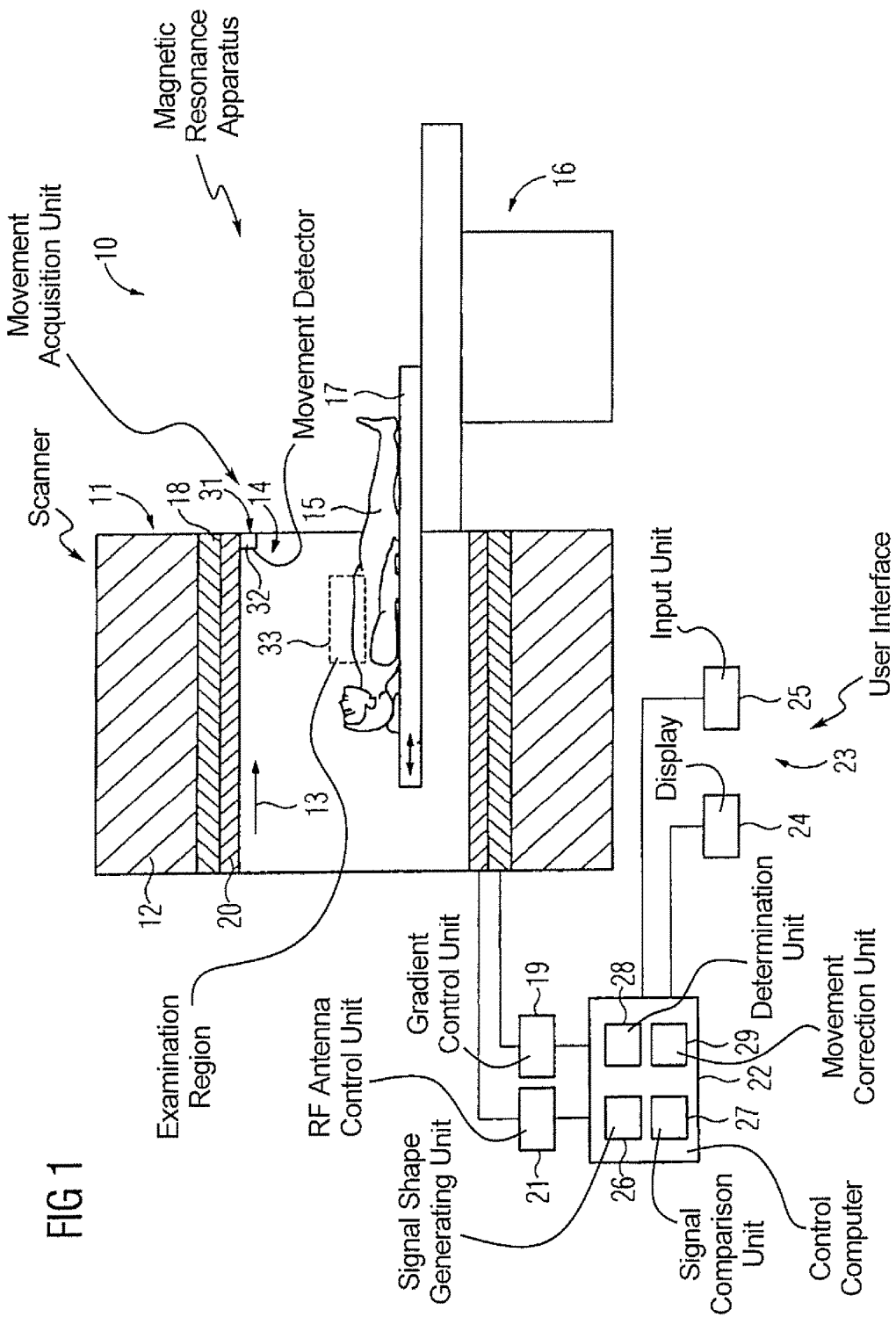

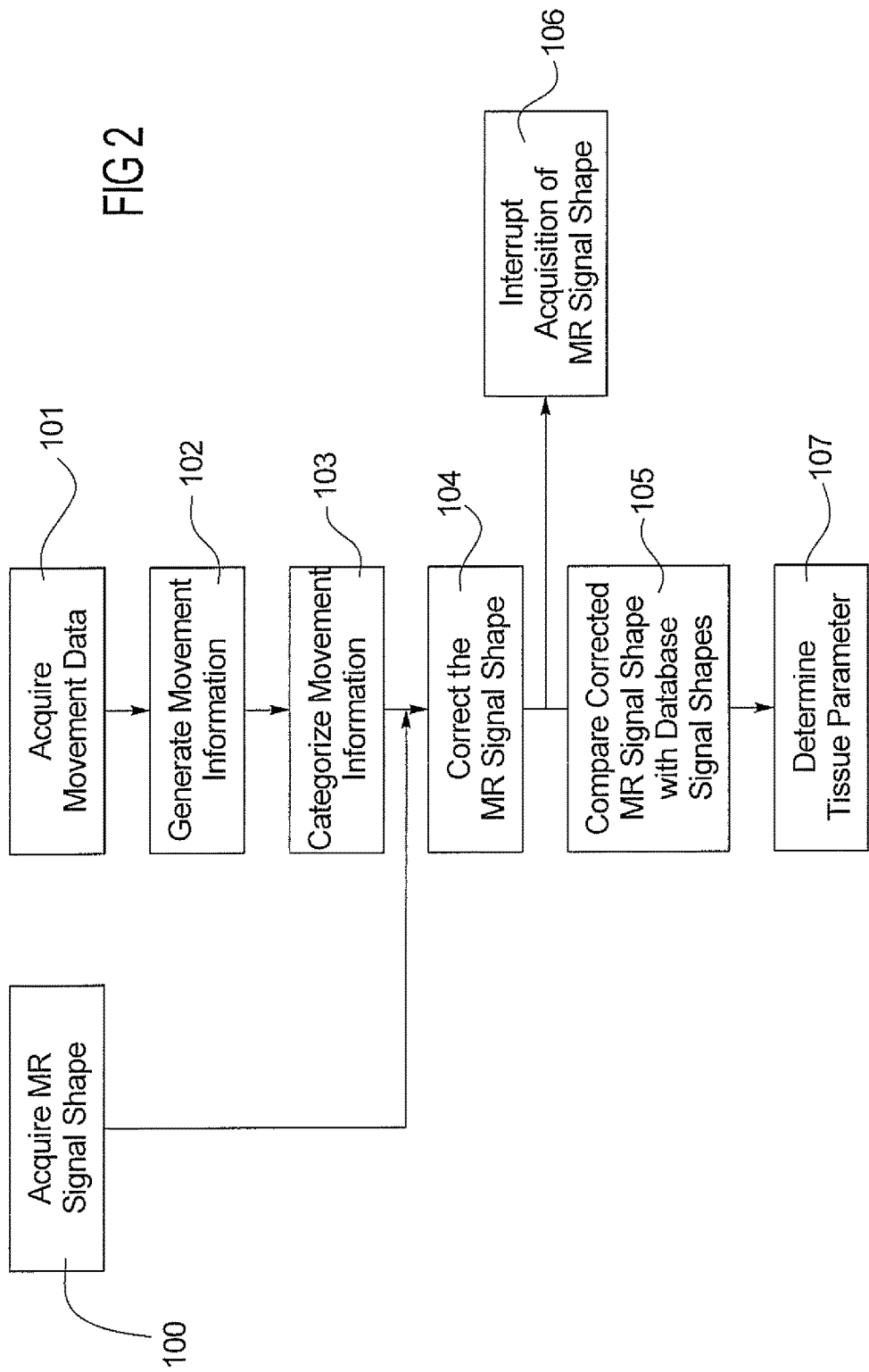

METHOD AND APPARATUS FOR MOVEMENT CORRECTION IN A MAGNETIC RESONANCE FINGERPRINTING EXAMINATION OF A SUBJECT

BACKGROUND OF THE INVENTION

Field of the Invention

The present invention concerns a method for movement correction in a magnetic resonance fingerprinting examination of a subject, and a magnetic resonance apparatus, and a non-transitory, data storage medium encoded with programming instructions, designed to implement such a method.

Description of the Prior Art

In a magnetic resonance examination of an object under examination, in particular on a patient, the object is exposed to a high basic magnetic field, for example 1.5 tesla or 3 tesla or 7 tesla, in a magnetic resonance scanner with the use of a basic magnet. In addition, gradient pulses are generated by gradient coils. A radio-frequency antenna arrangement emits radio-frequency pulses by suitable antenna elements, in particular excitation pulses, which cause nuclear spins of specific atoms, excited to resonance by these radio-frequency pulses, to be flipped by a defined flip angle relative to the magnetic field lines of the basic magnetic field. Upon relaxation of the nuclear spins, radio-frequency signals, known as magnetic resonance signals, are emitted by the nuclei and these signals are received by suitable radio-frequency antennas and then processed further. Finally, image data are reconstructed from raw data acquired in this manner.

The publication Ma et al., "Magnetic Resonance Fingerprinting", Nature, 495, 187-192 (Mar. 14, 2013) discloses a magnetic resonance fingerprinting method that can be used to determine quantitative values of tissue parameters of an object under examination.

SUMMARY OF THE INVENTION

An object of the present invention is to enable a magnetic resonance fingerprinting examination matched to the patient's movement.

The invention encompasses a method for movement correction for a magnetic resonance fingerprinting examination on an object under examination, which includes the following steps.

A magnetic resonance signal shape of a region to be examined of the object under examination is acquired by operating a magnetic resonance scanner to execute a magnetic resonance fingerprinting method.

Movement data are acquired by a movement detection for at least one sub-region of the region to be examined of the object under examination.

Movement information is generated in a computer from the acquired movement data for the at least one sub-region of the region to be examined.

The acquired magnetic resonance signal shape is corrected in the computer with reference to the generated movement information.

The corrected magnetic resonance signal shape is then configured in the computer with multiple database signal shapes that are stored in a database, with a database value of at least one tissue parameter being assigned to each of the database signal shapes.

The value of the at least one tissue parameter is determined from the signal comparison, and an electrical signal is emitted from the computer that represents the at least one tissue parameter.

The value of the at least one tissue parameter can be provided after its determination. For example, the value of the at least one tissue parameter can be notified to a user by means of a display unit and/or stored in a database. A spatially-resolved distribution of the value of the at least one tissue parameter in the region to be examined is determined. The at least one tissue parameter preferably characterizes a physical property of a tissue of the object under examination from which the magnetic resonance signal shape was acquired. The at least one tissue parameter can quantify a reaction of the tissue to radio-frequency excitation. The tissue of the object under examination can be, for example, brain tissue, bone tissue, fat tissue, muscle tissue, etc. It is also possible to determine tissue parameters for other types of tissue in the object under examination that appear appropriate to those skilled in the art. The at least one tissue parameter can be formed from one or more of the following tissue parameters: a T1 relaxation time, a T2 relaxation time, a diffusion value (for example an apparent diffusion coefficient, ADC), a magnetization moment, a proton density, a resonance frequency, a concentration of a material, a temperature, etc. It is also possible to determine several values of different tissue parameters, with, in this case, any combination of the tissue parameters being conceivable.

The magnetic resonance fingerprinting method preferably includes the acquisition of multiple magnetic resonance images of the region to be examined with different recording parameters being set for the acquisition of the different magnetic resonance images. The recording parameters can be varied, for example, in a pseudo-randomized manner. Possible recording parameters that are changed during the acquisition of multiple magnetic resonance images are, for example, an echo time, a configuration and/or number of radio-frequency pulses, a configuration and/or number of gradient pulses, a diffusion encoding, etc. During this variation, the multiple magnetic resonance images can be acquired during multiple repetition times with, in each case, it being possible to acquire a magnetic resonance image among the multiple magnetic resonance images during one repetition time of the multiple repetition times. The multiple magnetic resonance images are then used to generate the location-dependent (spatially-dependent) magnetic resonance signal shape.

A different value of the at least one tissue parameter is assigned respectively to the different database signal shapes. The database signal shapes represent the signal shape to be expected during the magnetic resonance fingerprinting method when a specimen having a value of the at least one tissue parameter corresponds to the associated database value is investigated. The database signal shapes can be determined, for example, in a calibration measurement and/or simulated. The magnetic resonance fingerprinting method results in one database signal shape among the multiple database signal shapes being assigned to the acquired magnetic resonance signal shape, as a result of the result of the signal comparison. The database value of the at least one tissue parameter belonging to the assigned database signal shape can be set as the measured value of the at least one tissue parameter. In this way, the value of the at least one tissue parameter can be determined with reference to the signal comparison. The value of the at least one tissue parameter determined with reference to the signal comparison then represents an actual measured value, while the database values of the at least one tissue parameter represent virtual values of the at least one tissue parameter.

It is also possible for multiple database values for multiple tissue parameters to be assigned to each database signal shape. In this case, the signal comparison results in multiple values of the at least one tissue parameter simultaneously. All that is required is the acquisition of a single magnetic resonance signal shape for a voxel of the region to be examined, in order to determine all the values of the multiple tissue parameters by the magnetic resonance fingerprinting method for that voxel. For a more detailed description of an exemplary function of a magnetic resonance fingerprinting method, references can be made to the publication by Ma et al. noted above.

A temporally successive acquisition of the multiple magnetic resonance signal shapes can render the magnetic resonance fingerprinting method vulnerable to movement of the object under examination. The movement of the object under examination can result in movement-induced deviations in the magnetic resonance signal shapes that are generated. This can then result in problems with the signal comparison since, as a result of the movement, changed magnetic resonance signal shapes are present and the database signal shapes are not movement-dependent. This can result in faulty assignments of the at least one tissue parameter to the acquired signal shapes. In this case, the longer the magnetic resonance examination lasts, the greater the probability of the object under examination, in particular a patient, making an unwanted movement and negatively influencing the magnetic resonance fingerprinting method.

The method according to the invention advantageously enables a magnetic resonance fingerprinting method to be adapted to a movement of the object under examination, in particular the patient. The movement correction in accordance with the invention advantageously results in increased precision during the signal comparison, so that it is possible to determine values of the at least one tissue parameter that are as exact as possible. This enables the quality and informative value of a determined tissue parameter map to be increased. This, in turn, enables errors in the assignment of the tissue classes to be advantageously minimized and/or prevented.

Preferably, the acquisition of the movement data for at least one sub-region of the region to be examined of the object under examination is performed simultaneously with the acquisition of the magnetic resonance signal shape so that current movement information for an acquired magnetic resonance signal shape is always present or can be determined. In addition, the determined or generated movement information is preferably assigned to the acquired magnetic resonance signal shape.

Preferably, the determination of the value of the at least one tissue parameter is performed for each voxel of the depicted region to be examined, so that high spatial resolution can be achieved with the compilation of a tissue parameter map. In this case, it is also possible to achieve a precise separation between different regions of tissue in the image data. Thus, the movement information enables a movement and/or a position change to be determined for each voxel and in this way the determination of the value of the at least one tissue parameter for each voxel can be corrected and/or influenced by the movement information.

In a further embodiment of the invention, the movement information of the at least one sub-region of the object under examination is acquired separately from the magnetic resonance fingerprinting examination. This enables a movement of the patient to be determined particularly quickly with reference to the acquired movement data. It is thus possible to dispense with the complex reconstruction of a movement from the acquired magnetic resonance data. This also enables the magnetic resonance fingerprinting method to be stopped and/or interrupted upon the acquisition of a movement of the patient and resumed again when the acquired movement has finished.

In this case, the movement information of the at least one sub-region of the region to be examined of the object under examination is acquired by of at least one separate movement detector. In this context, a separate movement detector means a movement detector embodied separately and/or apart from the scanner of the magnetic resonance apparatus, so that the acquisition of the movement data is independent of the acquisition of magnetic resonance data. In particular, the acquisition of movement information for the region to be examined during the magnetic resonance fingerprinting method can be performed independently of the magnetic resonance fingerprinting method. Here, the at least one separate movement detector can be arranged at the magnetic resonance apparatus. The at least one separate movement detector can be, for example, a camera and/or location markings. It is also possible to use further movement sensors that are considered appropriate to those skilled in the art.

In an embodiment of the invention, the movement information is categorized following the generation of the movement information. This makes it particularly simple to assign the movement information to a further procedure and hence to simplify the further procedure greatly. Preferably, at least two different movement information categories, but particularly advantageously three different movement information categories are available for the movement information. For example, a movement information category can be available for a temporary movement and/or a movement information category for a permanent position change and/or a movement information category for an idle state. For example, during the correction of the acquired magnetic resonance signal shape, when the movement information assigned to the movement information category "idle state," this causes the corrected magnetic resonance signal shape to correspond to the acquired magnetic resonance signal shape. In addition, during the correction of the acquired magnetic resonance signal shape, movement information assigned to the movement information category "temporary movement" and/or the movement information category "permanent position change" causes the acquired magnetic resonance signal shape to be changed in accordance with the movement, or left out of consideration in the further evaluation.

In a further embodiment of the invention, for the duration of the movement, the image data of the acquired magnetic resonance signal shape are marked in a movement information category "temporary movement" and/or in a movement information category "permanent position change." This enables the acquired image data of the magnetic resonance signal shape to be assigned particularly simply and quickly to a movement of the patient and such data are then taken into account during an evaluation, in particular the determination of the value of the at least one tissue parameter. For example, in this case, the image data acquired during the movement of the patient of the movement information category "temporary movements" and/or the movement information category "permanent position change" are marked and/or identified in a buffer memory. It is also possible for the marking of the acquired image data of the magnetic resonance signal shape in the movement information category "temporary movements" to differ from the marking of the acquired image data of the magnetic resonance signal shape in the movement information category "permanent position change."

In this context, a temporary movement means a movement of the patient for which, after the movement, the moved sub-region and/or the moving sub-region of the patient returns to the position and orientation it had before the movement. Consequently, a position and orientation of the moved sub-region and/or of the moving sub-region of the patient is the same before and after the movement. A temporary movement can be, for example, a breathing movement, a swallowing moving of the patient, a coughing movement of the patient, etc.

A permanent position change means a movement of the patient for which the moved sub-region and/or the moving sub-region of the patient changes its position permanently. Consequently, a position and orientation of the moved sub-region and/or of the moving sub-region of the patient before the movement is different from a position and orientation of the moved sub-region and/or of the moving sub-region of the patient after the movement. A permanent position change can be, for example, a rotation of the head of the patient, an arm movement of the patient etc.

In accordance with the invention if the movement information is in the movement information category "temporary movements" and/or the movement information category "permanent position change," for the duration of the movement, the image data of the acquired magnetic resonance signal shape are not taken into account during the signal comparison with the multiple database signal shapes stored in a database. In this way, advantageously, an unwanted faulty assignment of tissue parameters to a voxel, and hence to a sub-region of the patient, can be prevented. In this case, signal changes in the magnetic resonance signal shapes caused by the movement of the patient can be left out of consideration during the determination of a tissue class and hence faulty analysis avoided. In this case, the corrected magnetic resonance signal shape can be, for example, an error message, since an exact determination of the value of the at least one tissue parameter is not possible due to the movement of the patient and the signal change to the acquired magnetic resonance signal shapes resulting therefrom. Alternatively, in such a case the corrected magnetic resonance signal shape can be the last magnetic resonance signal shape without movement with the additional designation that no current magnetic resonance signal shape is present.

In another embodiment of the invention, in the case of the movement information being in the movement information category "temporary movement" and/or the movement information category "permanent position change," the acquisition of a magnetic resonance signal shape for the moved sub-region is interrupted for the duration of the movement and is restarted when the movement has finished. In this way, it can be ensured that, when processing or evaluating the acquired image data for the acquisition of the magnetic resonance signal shape, the image data that are assigned to the movement are not taken into account, and also cannot be inadvertently taken into account, for the determination of the tissue parameters. This also enables the acquisition of unusable magnetic resonance signal shapes to be advantageously dispensed with.

In a further embodiment of the invention, if the movement information is in the movement information category "permanent position change," when the movement for the moved sub-region ceases, a new position of the moved sub-region is taken into account during the correction of the acquired magnetic resonance signal shape. In this way, a position change and/or a location change of the moved sub-region can be included in the determination of the value of the at least one tissue parameter so that a value of the at least one tissue parameter can always be reliably assigned to a current, corrected magnetic resonance signal shape.

In this case, the corrected magnetic resonance signal shape can be determined by means of a rotation matrix. The rotation matrix can compensate a signal change, which occurs in corresponding voxels due to the position change of at least one sub-region of the region to be examined. The rotation matrix, in particular individual parameters of the rotation matrix, is adapted to a respective position change so that the signal change in the magnetic resonance signal shapes can be compensated as a function of the position change. It is also possible for different parameters to be specified for different voxels in the acquired image data within the rotation matrix in order to compensate the movement of the corresponding sub-regions of the patient.

The invention also encompasses a magnetic resonance apparatus with a scanner, a movement acquisition unit, a system control computer and a user interface, wherein the system control computer includes a signal shape generating processor, a signal comparison processor, a determination processor and a movement correction processor. The magnetic resonance apparatus is configured to implement the method for movement correction for a magnetic resonance fingerprinting examination on an object under examination according to the method described above.

Accordingly, the scanner of the magnetic resonance apparatus is operated to acquire a magnetic resonance signal shape of a region to be examined of the object under examination by executing magnetic resonance fingerprinting method.

A movement detector detects movement data for at least one sub-region of the region to be examined of the object under examination.

Movement information are generated by the control computer with reference to the acquired movement data for the at least one sub-region of the region to be examined.

The computer corrects the acquired magnetic resonance signal shape with reference to the generated movement information.

The computer makes signal comparison of the corrected magnetic resonance signal shape with multiple database signal shapes, stored in a database with a database value of a least one least tissue parameter being assigned to each of the database signal shapes.

The computer determines a value of the at least one tissue parameter with reference to the signal comparison, and emits an electrical signal that represents the at least one tissue parameter.

The apparatus according to the invention enables a magnetic resonance fingerprinting method to be adapted to movement of the object under examination, in particular of the patient. The movement correction results in increased precision during the signal comparison so the most exact possible values of the at least one tissue parameter can be determined. This enables the quality and informative value of a determined tissue parameter map to be increased. This enables errors in the assignment of the tissue classes to be advantageously minimized and/or prevented.

The advantages of the magnetic resonance apparatus according to the invention substantially correspond to the advantages of the method according to the invention for movement correction for a magnetic resonance fingerprinting examination on an object under examination, explained above in detail above. All features, advantages or alternative embodiments mentioned in connection with the method are applicable to the apparatus.

The invention also encompasses a non-transitory, computer-readable data storage medium that can be loaded directly into a memory of a programmable system control computer of a magnetic resonance apparatus. The storage medium is encoded with programming instructions that cause the computer to implement the method for movement correction for a magnetic resonance fingerprinting examination on an object under examination when the programming instructions are executed in the system control computer of the magnetic resonance apparatus.

BRIEF DESCRIPTION OF THE DRAWINGS

FIG. 1 schematically illustrates a magnetic resonance apparatus according to the invention.

FIG. 2 is a flowchart of the method according to the invention for movement correction for a magnetic resonance fingerprinting examination.

DESCRIPTION OF THE PREFERRED EMBODIMENTS

FIG. 1 schematically shows a magnetic resonance apparatus 10. The magnetic resonance apparatus 10 has a scanner 11 that embodies a superconducting basic field magnet 12 for generating a strong and constant, basic magnetic field 13. The magnetic resonance apparatus 10 also has a patient receiving region 14 for receiving a patient 15. In the exemplary embodiment, the patient receiving region 14 is configured in a cylindrical shape and is enclosed in a cylindrical manner in a circumferential direction by the scanner 11. However, in principle a different configuration of the patient receiving region 14 is conceivable at any time. The patient 15 can be moved into the patient receiving region 14 by a patient support 16 of the magnetic resonance apparatus 10. To this end, the patient support 16 has a patient table 17 that may be moved within the patient receiving region 14.

The scanner 11 also has a gradient coil unit 18 for generating magnetic field gradients used for spatial encoding during imaging. The gradient coil unit 18 is controlled by a gradient control unit 19 of the magnetic resonance apparatus 10. The scanner 11 further has a radio-frequency antenna unit 20, which, in the present exemplary embodiment, is a fixed whole body coil integrated in the scanner 11. The radio-frequency antenna unit 20 is operated to excite polarization established in the basic magnetic field 13 generated by the basic field magnet 12. The radio-frequency antenna unit 20 is controlled by a radio-frequency antenna control unit 21 of the magnetic resonance apparatus 10 and emits radio-frequency magnetic resonance sequences into an examination chamber substantially formed by a patient receiving region 14 of the magnetic resonance apparatus 10. The radio-frequency antenna unit 20 is also embodied to receive magnetic resonance signals.

To control the scanner 11, the gradient control unit 19, and the radio-frequency control unit 21, the magnetic resonance apparatus 10 has a system control computer 22. The system control computer 22 controls the magnetic resonance apparatus 10 centrally, such as, for example, in the performance of a predetermined imaging gradient echo sequence. The system control computer 22 also includes evaluation circuitry or software (not shown in further detail) for evaluating medical image data acquired during the magnetic resonance examination. The magnetic resonance apparatus 10 also has a user interface 23 connected to the system control computer 22. Control information, such as, for example, imaging parameters, and reconstructed magnetic resonance images can be displayed on a display 24, for example on at least one monitor, of the user interface 23 for a medical operator. The user interface 23 also has an input unit 25 via which the medical operator can enter information and/or parameters during a measuring operation.

In the exemplary embodiment, the system control computer 22 comprises a signal shape generating unit 26, a signal comparison unit 27, a determination unit 28 and a movement correction unit 29, all formed of a processor, processor stage or processor module (hardware and/or software) of the system control computer 22. The magnetic resonance device also comprises a signal shape acquisition unit 30. In the present exemplary embodiment, the signal shape acquisition unit 30 is formed by the scanner 11.

For the acquisition of a movement of the patient 15 during the acquisition of magnetic resonance data in a magnetic resonance fingerprinting examination, the magnetic resonance apparatus 10 has a movement acquisition unit 31. The movement acquisition unit 31 is embodied separately from the scanner 11 and, in the exemplary embodiment, has a single movement detector 32 embodied as a camera. In an alternative embodiment of the movement acquisition unit 31, it can have more than one movement detector 32. An alternative embodiment of the movement detector 32 or the movement sensors 32 to the exemplary embodiment shown here is also conceivable. In the exemplary embodiment, the movement detector 32 is situated within the patient receiving region 14 on a part of the housing of the magnetic scanner 11 encloses the patient receiving region 14.

The magnetic resonance apparatus 10, in particular the scanner 11, together with the system control computer 22 and the movement acquisition unit 31, are designed to implement the inventive method according to the invention for movement correction for a magnetic resonance fingerprinting examination on an object under examination, in particular the patient 15. FIG. 2 is a flowchart of the method according to the invention for movement correction for a magnetic resonance fingerprinting examination. The system control unit 22 has suitable software and/or computer programs, which can be loaded in a memory of the system control computer 22, with programming instructions that cause the method for movement correction for a magnetic resonance fingerprinting examination to be implemented when the program with instructions are executed in the system control computer 22 of the magnetic resonance apparatus 10.

The method for movement correction for a magnetic resonance fingerprinting examination on an object under examination, in particular the patient 15, has a first method step 100, in which the signal shape acquisition unit 30 (scanner 11) of the magnetic resonance apparatus 10 acquires a magnetic resonance signal shape of a region to be examined 33 of the patient 15 by using a magnetic resonance fingerprinting method. For example, multiple magnetic resonance images can be recorded (acquired) in the magnetic resonance fingerprinting method. In this case, the magnetic resonance fingerprinting method is based on a pseudo-random variation or changing of recording parameters that are used during the recording of the magnetic resonance images. The magnetic resonance signal shape is then formed from the multiple magnetic resonance images. In this case, the signal shape is formed from the multiple magnetic resonance images using each voxel of each of the magnetic resonance images.

At the same time as the method step 100 for the acquisition of the magnetic resonance signal shape, in a further method step 101, movement data of the object under examination, in the present case of the patient 15, are acquired for at least one sub-region of the region to be examined 33 of the object under examination. In this case, the sub-region of the region to be examined 33 can be the entirety of the region to be examined 33. Alternatively, the sub-region of the region to be examined 33 can be restricted to only those regions of the region to be examined 33 that are able to carry out a movement. In this case, the acquisition of the movement data is performed by the movement acquisition unit 31, in particular by the movement detector 32. In this case, the acquisition of the movement data of the at least one sub-region of the region to be examined 33 of the object under examination is performed separately from the magnetic resonance fingerprinting examination, so that the acquisition of the movement data and the acquisition of the magnetic resonance signal shape are performed independently of one another.

Then, in a further method step 102, movement information for the at least one sub-region of the region to be examined 33 of the object under examination is generated with the acquired movement data being included in the calculation and/or generation of the movement information. To this end, the acquired movement data are transferred to the system control computer 22, in particular to the movement correction unit 29 thereof, and there the movement information is generated by the movement correction unit 29. Alternatively, the generation of the movement information can be performed within the movement acquisition unit 31, which for that purpose can then include its own evaluation unit (not shown). In the method step 102, the movement correction unit 29 determines data movement information for each voxel of the acquired magnetic resonance data and assigns it to the acquired magnetic resonance signal shapes.

In order to take account of the movement information during a signal comparison of the magnetic resonance signal shape with multiple database signal shapes stored in a database, in a further method step 103, the movement information is categorized by the movement correction unit 29. Depending on the nature of the movement, the generated movement information is assigned to a movement information category "temporary movement" or a movement information category "permanent movement" by the movement correction unit 29.

A temporary movement is a movement of the patient 15 for which, after the movement, the moved sub-region and/or the moving sub-region of the patient 15 returns to the position and orientation it had before the movement. Consequently, a position and orientation of the moved sub-region and/or of the moving sub-region of the patient 15 is the same before and after the movement. A temporary movement can be, for example, a breathing movement of the patient 15 or a swallowing movement of the patient 15, or a coughing movement of the patient 15, etc.

A permanent position change is a movement of the patient 15 for which the moved sub-region and/or the moving sub-region of the patient 15 changes its position permanently. Consequently, a position and orientation of the moved sub-region and/or of the moving sub-region of the patient 15 before the movement is different from a position and orientation of the moved sub-region and/or of the moving sub-region of the patient 15 after the movement. A permanent position change can be, for example, a rotation of the head of the patient 15, or an arm movement of the patient 15, etc.

If no movement is present, the movement information is assigned to a further movement information category by the movement correction unit 29. The further movement information category designates an idle state.

In a subsequent method step 104, the movement correction unit 29 corrects the acquired magnetic resonance signal shape. The correction of the acquired magnetic resonance signal shape is performed with reference to the generated movement information. If the movement information designates the movement information category "idle state" for the acquired magnetic resonance signal shape, in the method step 104, the corrected magnetic resonance signal shape is the same as the acquired magnetic resonance signal shape, so that the magnetic resonance signal shape remains unchanged for a further consideration and/or evaluation.

If the movement information for a magnetic resonance signal shape which is assigned to one of the two movement information categories "temporary movement" or "permanent position change," the movement correction unit 29 marks the assigned acquired magnetic resonance signal shape in the further method step 104. This can take place, for example, in a buffer memory in which the acquired magnetic resonance signal shape is buffered. In this case, a marking and/or identification of an acquired magnetic resonance signal shape with the movement information category "temporary movement" is different from a marking and/or identification of an acquired magnetic resonance signal shape of the movement information category "permanent position change." The acquisition of the movement data in the method step 101 and the generation of the movement information in the method step 102 take place continuously, so that the duration of the movement can be acquired and all acquired magnetic resonance signal shapes are marked in this way by the movement correction unit 29, for the duration of the movement.

In the case of permanent position changes, following the duration of the movement, the moved body parts are located in a new position which is taken into account by the movement correction unit 29 in the method step 104. The new or changed position causes signal changes in the magnetic resonance signal shape that are compensated by the movement correction unit 29 by the use of a rotation matrix. The rotation matrix uses the acquired magnetic resonance signal shape to determine a corrected magnetic resonance signal shape for the new position which substantially corresponds to an acquired magnetic resonance signal shape before the movement. Preferably, the rotation matrix, in particular individual parameters of the rotation matrix, are adapted to a respective position change so that the signal change that occurs in the magnetic signal shapes can be compensated as a function of the position change. Different parameters can be specified for different voxels in the acquired image data with the rotation matrix, in order to compensate the movement of the corresponding sub-regions of the patient.

In a method step 105, a signal comparison of the magnetic resonance signal shape, corrected in the method step 104, is made with multiple database signal shapes stored in a database, by operation of the signal comparison unit 27 of the system control unit 22. In this case, the database is accessible by the system control computer 22 at least in the sense of a data exchange. A database value of at least one tissue parameter is assigned to each of the database signal shapes. The signal comparison can be performed by conventional pattern recognition method and/or by a simple correlation analysis. As a result of the signal comparison, a comparison parameter is produced for each comparison, which characterizes the degree of conformity of the magnetic resonance signal shape with the database signal shapes.

As an example, two tissue parameters are to be determined, namely a T1 relaxation time and a T2 relaxation time. The at least one tissue parameter can also include a different number of tissue parameters. The at least one tissue parameter can also be other tissue parameters, such as a diffusion value (for example an apparent diffusion coefficient, ADC), a magnetization moment, a proton density, a resonance frequency, a concentration of a material, a temperature, etc. For purposes of illustration, for example, there should be 2900 database values for the T1 relaxation time, which in millisecond steps cover the range from 101 ms to 3000 ms, and 990 database values of the T2 relaxation time, which in millisecond steps cover the range from 11 ms to 1000 ms. Consequently, the database has a total of 2871000 database signal shapes with each of the database signal shapes being assigned to a doublet of the T1 relaxation time and T2 relaxation time. The database signal shapes can be determined, for example, in a simulation for the different database values for the T1 relaxation time and the T2 relaxation time.

If the acquired magnetic resonance signal shape is assigned to the movement information category "idle state," the signal comparison in the method step 105 is performed by with the corrected magnetic resonance signal shape being the same as the acquired magnetic resonance signal shape. If the acquired magnetic resonance signal shape is assigned to the movement category "permanent position change" and the movement has finished, the signal comparison in the method step 105 is performed using the corrected magnetic resonance signal shape that was corrected in the method step 104 by the use of a rotation matrix.

If the acquired magnetic resonance signal shape is assigned to the movement information category "temporary movement" or "permanent position change" and the movement is still ongoing, the acquired magnetic resonance signal shape is marked or identified in the method step 104 by the movement correction unit 29. Due to this identification, no current signal comparison between a corrected magnetic resonance signal shape and the multiple database signal shapes stored in the database is performed in the method step 105, so that the marked magnetic resonance signal shapes are not taken into account in the further method step 105. Such movements of the patient 15 cause a change to the magnetic resonance signal shape so that this would result in a faulty result if taken into account in providing the magnetic resonance signal shape. In this case, in the method step 105, the signal comparison unit 27 can assign a value to the comparison result of the signal comparison that indicates to a user that no current comparison results are available due to a movement of the patient 15. In addition, it is also possible for the last signal comparison result to be retained with the additional indication that, due to a movement, no current comparison results are currently available.

Alternatively or additionally, in an optional method step 106, in the case of the movement information being in the movement information category "temporary movement" or the movement information category "permanent position change," the movement correction unit 29 can interrupt the acquisition of the magnetic resonance signal shape for the moved sub-region of the region to be examined and, when the movement has finished, the acquisition of the magnetic resonance signal shape is started again. Here, once again, no current signal comparison between a corrected magnetic resonance signal shape and the multiple database signal shapes stored in a database would be performed in the method step 105, since the movement of the patient 15 causes a change in the magnetic resonance signal shape that would lead to a faulty result if taken into account in producing the magnetic resonance signal shape. Here once again, in the method step 105, the signal comparison unit 27 can assign a value to the comparison result of the signal comparison that indicates to a user that no current comparison results are available due to a movement of the patient 15. In addition, the last signal comparison result can be retained with the additional indication that, due to a movement, no current comparison results are currently available.

In a further method step 107, a value of the at least one tissue parameter is determined with reference to the signal comparison by operation of the determination unit 28 of the system control computer 22. In the above example, in the signal comparison, a suitable database signal shape of the multiple database signal shapes with the greatest conformity with the magnetic resonance signal shape was determined. The T1 relaxation time and T2 relaxation time associated with the database signal shape are then set as the value of the at least one tissue parameter.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for movement correction in a magnetic resonance fingerprinting examination of an object, comprising:

operating a magnetic resonance scanner, while an object is situated therein, to execute a magnetic resonance fingerprinting method wherein a magnetic resonance signal shape of a region of the object is acquired;

detecting movement data for at least one sub-region of said region;

in a computer, generating movement information for said at least one sub-region from the detected movement data;

in said computer, correcting the acquired magnetic resonance signal shape dependent on the generated movement information;

categorizing said movement information into one category among a plurality of categories designating temporary movement and permanent position change of said magnetic resonance signal shape, and marking said magnetic resonance signal shape as being in that respective category for a duration of said movement;

for any categorization of said magnetic resonance signal shape in the category temporary movement or the category permanent position change, automatically interrupting acquisition of said magnetic resonance signal shape for a duration of the movement, and starting acquisition again of said magnetic resonance signal shape when said movement has ceased;

in said computer, comparing the corrected magnetic resonance signal shape with multiple database signal shapes accessed from a database, with each of said multiple database signal shape having a value of at least one tissue parameter assigned thereto in said database; and dependent on said comparison, assigning a value of at least one tissue parameter to the corrected signal shape, and generating and emitting an electronic signal from said computer that designates said value of said at least one tissue parameter determined from said comparison.

2. A method as claimed in claim 1 wherein said magnetic resonance signal shape comprises a plurality of voxels, and determining said at least one value of said at least one tissue parameter for each voxel.

3. A method as claimed in claim 1 comprising detecting said movement information separately from said magnetic resonance fingerprinting method.

4. A method as claimed in claim 3 comprising detecting said movement information with a movement detector that is separate from said magnetic resonance scanner.

5. A method as claimed in claim 1 comprising categorizing said movement information after generating said movement information.

6. A method as claimed in claim 1 comprising, for any magnetic resonance signal shape having movement in the category of temporary movement or permanent position change, not using said magnetic resonance signal shape in said comparison with said multiple database signal shapes.

7. A method as claimed in claim 1 comprising, for a signal shape with movement categorized in the category permanent position change, generating said corrected magnetic resonance signal shape with a new position.

8. A method as claimed in claim 7 comprising generating said new position by applying a rotation matrix to the magnetic resonance signal shape with movement designated in said category permanent position change.

9. A magnetic resonance apparatus comprising:
a magnetic resonance scanner;
a control computer configured to operate said magnetic resonance scanner, while an object is situated therein, to execute a magnetic resonance fingerprinting method wherein a magnetic resonance signal shape of a region of the object is acquired;
a movement detector that detects movement data for at least one sub-region of said region;
a processor configured to generate movement information for said at least one sub-region from the detected movement data;
said processor being configured to correct the acquired magnetic resonance signal shape dependent on the generated movement information;
said computer being configured to categorize said movement information into one category among a plurality of categories designating temporary movement and permanent position change of said magnetic resonance signal shape, and to mark said magnetic resonance signal shape as being in that respective category for a duration of said movement;
said computer being configured, for any categorization of said magnetic resonance signal shape in the category temporary movement or the category permanent position change, to automatically interrupt acquisition of said magnetic resonance signal shape for a duration of the movement, and to start acquisition again of said magnetic resonance signal shape when said movement has ceased;
said processor being configured to compare the corrected magnetic resonance signal shape with multiple database signal shapes accessed from a database, with each of said multiple database signal shapes having a value of at least one tissue parameter assigned thereto in said database; and
said processor being configured to assign, dependent on said comparison, a value of at least one tissue parameter to the corrected signal shape, and to generate and emit an electronic signal from said computer that designates said value of said at least one tissue parameter determined from said comparison.

10. A non-transitory, computer-readable data storage medium encoded with programming instructions, said storage medium being loaded into a computer system of a magnetic resonance apparatus, that also comprises a magnetic resonance scanner and said programming instructions causing said control computer system to:
operate said magnetic resonance scanner, while an object is situated therein, to execute a magnetic resonance fingerprinting method wherein a magnetic resonance signal shape of a region of the object is acquired;
receive movement data for at least one sub-region of said region;
generate movement information for said at least one sub-region from the detected movement data;
correct the acquired magnetic resonance signal shape dependent on the generated movement information;
categorize said movement information into one category among a plurality of categories designating temporary movement and permanent position change of said magnetic resonance signal shape, and mark said magnetic resonance signal shape as being in that respective category for a duration of said movement;
for any categorization of said magnetic resonance signal shape in the category temporary movement or the category permanent position change, automatically interrupt acquisition of said magnetic resonance signal shape for a duration of the movement, and start acquisition again of said magnetic resonance signal shape when said movement has ceased;
compare the corrected magnetic resonance signal shape with multiple database signal shapes accessed from a database, with each of said multiple database signal shapes having a value of at least one tissue parameter assigned thereto in said database; and
dependent on said comparison, assign a value of at least one tissue parameter to the corrected signal shape, and generate and emit an electronic signal from said computer that designates said value of said at least one tissue parameter determined from said comparison.

* * * * *